United States Patent
Marvin et al.

(10) Patent No.: US 9,813,008 B2
(45) Date of Patent: Nov. 7, 2017

(54) HALF-BRIDGE SWITCHING CIRCUIT SYSTEM

(71) Applicants: Russel Hugh Marvin, Goshen, CT (US); David H. Leach, Torrington, CT (US)

(72) Inventors: Russel Hugh Marvin, Goshen, CT (US); David H. Leach, Torrington, CT (US)

(73) Assignee: LCDRIVES CORP, Goshen, CT (US)

( * ) Notice: Subject to any disclaimer, the term of this patent is extended or adjusted under 35 U.S.C. 154(b) by 0 days.

(21) Appl. No.: 15/092,064

(22) Filed: Apr. 6, 2016

(65) Prior Publication Data
US 2017/0294859 A1    Oct. 12, 2017

(51) Int. Cl.
*H02P 3/00*    (2006.01)
*H02P 27/04*   (2016.01)
*H02M 7/00*    (2006.01)
*H03K 17/687*  (2006.01)

(52) U.S. Cl.
CPC ......... *H02P 27/04* (2013.01); *H02M 7/003* (2013.01); *H03K 17/6871* (2013.01)

(58) Field of Classification Search
CPC ...................................................... H02P 27/04
USPC .................................................. 318/504, 494
See application file for complete search history.

(56) References Cited

U.S. PATENT DOCUMENTS

| 5,038,088 A * | 8/1991 | Arends ................. G05B 19/23 310/58 |
| 8,503,195 B1 * | 8/2013 | Mogilevski ......... H02M 3/3376 363/21.03 |
| 8,866,169 B2 * | 10/2014 | Emerson ................. H01L 33/58 257/98 |

* cited by examiner

*Primary Examiner* — David S Luo
(74) *Attorney, Agent, or Firm* — Tarolli, Sundheim, Covell & Tummino LLP (57) ABSTRACT

One example includes a half-bridge switching circuit system. The system includes a first plurality of switches arranged between a first rail voltage and an output on which an output voltage is provided and a second plurality of switches arranged between a second rail voltage and the output, the first and second pluralities of switches being controlled via a plurality of switching signals. The system also includes a plurality of flying capacitors arranged to interconnect the first and second pluralities of switches, and further includes a plurality of snubber circuits that are each arranged in parallel with a respective one of the plurality of flying capacitors, the first plurality of switches, and the second plurality of switches.

23 Claims, 4 Drawing Sheets

HALF-BRIDGE SWITCHING CIRCUIT SYSTEM

GOVERNMENT INTEREST

This invention was made with Government support under 1519745 awarded by the National Science Foundation. The Government has certain rights to this invention.

TECHNICAL FIELD

The present description relates generally to electronic circuits, and specifically to a half-bridge switching circuit system.

BACKGROUND

Half-bridge switching circuits can be implemented for a variety of applications to provide an output current/output voltage. As an example, motor drives can be implemented with half-bridge switching circuits. Many of the applications of motors in modern society implement variable speed drives to save energy, and all variable speed applications require an electronic drive to control the speed of the respective motor(s). Most variable-speed motor drives today use two-level converter architectures where each leg of the drive is a half-bridge switching circuit comprised of two switches. This configuration requires that each switch be rated for the full voltage of the application but minimizes the number of required parts and simplifies the design and control of the motor drive. Multi-level converters with three or more hard-switched voltage levels have also been developed for medium and high-power applications because they can generate higher quality output waveforms and achieve higher output voltages than the ratings of individual solid-state switching devices.

SUMMARY

One example includes a half-bridge switching circuit system. The system includes a first plurality of switches arranged between a first rail voltage and an output on which an output voltage is provided and a second plurality of switches arranged between a second rail voltage and the output, the first and second pluralities of switches being controlled via a plurality of switching signals. The system also includes a plurality of flying capacitors arranged to interconnect the first and second pluralities of switches, and further includes a plurality of snubber circuits that are each arranged in parallel with a respective one of the plurality of flying capacitors, the first plurality of switches, and the second plurality of switches.

Another embodiment includes a circuit system. The system includes a printed-circuit board (PCB) comprising a surface on which a plurality of circuit components are arranged. The system also includes at least one thermally-conductive component that is coupled to the PCB, the at least one thermally-conductive component being configured to conduct heat that is generated on the PCB via the plurality of circuit components. The system further includes a T-clad material arrangement that is coupled to the at least one thermally-conductive component via a first material layer and is configured to conduct the heat from the at least one thermally-conductive component to the first material layer.

Another embodiment includes a motor driver system. The system includes a motor controller configured to generate a plurality of switching signals. The system also includes a half-bridge switching circuit configured to provide an output voltage via an output. The half-bridge switching circuit includes a first plurality of switches arranged between a first rail voltage and the output and a second plurality of switches arranged between a second rail voltage and the output. The first and second pluralities of switches can be controlled via the plurality of switching signals. The half-bridge switching circuit further includes a plurality of flying capacitors arranged to interconnect the first and second pluralities of switches, and further includes a plurality of snubber circuits such that each of the plurality of flying capacitors, each of the first plurality of switches, and each of the second plurality of switches is arranged in parallel with a respective one of the plurality of snubber circuits. The system further includes a double-sided printed-circuit board (PCB) comprising a first surface on which the first plurality of switches are arranged and a second surface on which the second plurality of switches are arranged. The second surface is opposite the first surface on the double-sided PCB.

DETAILED DESCRIPTION

The present description relates generally to electronic circuits, and specifically to a half-bridge switching circuit system. As an example, the half-bridge switching circuit system can be implemented in a motor driver system to control a motor. For example, the motor driver system can be implemented to provide variable speed control of a motor, such as a three-phase motor. The motor driver system includes a motor controller that is configured to generate a plurality of switching signals, such as based on a desired speed of the associated motor. The half-bridge switching circuit can thus be configured to provide an output voltage to the motor to set the speed of the motor. The half-bridge switching circuit includes a plurality of switches, such as a first set of switches interconnecting a first voltage rail (e.g., a positive voltage rail) and the output and a second set of switches interconnecting a second voltage rail (e.g., a negative voltage rail) and the output. For example, the switches can be arranged as gallium nitride (GaN) switches that can be implemented for very high speed switching. The half-bridge switching circuit also includes a plurality of flying capacitors that interconnect the first and second sets of switches in a cascaded arrangement, such as to provide the output voltage as having a variable amplitude based on the complementary activation of the sets of switches.

The half-bridge switching circuit also includes a plurality of snubber circuits that can each be arranged in parallel with the switches of each of the first and second sets of switches and with the flying capacitors. The snubber circuits can each include a series arrangement of a capacitor and a resistor, and can thus be configured to substantially mitigate the effects of unavoidable stray circuit inductance in series with the respective switches and flying capacitors. A peak voltage across the switches during voltage overshoot on switching transitions can increase as switching time decreases (e.g., because of the momentary voltage generated across the stray inductances in the circuit when the current transitions rapidly), but decreases with the addition of the snubber circuits which can partially absorb the energy stored in the stray inductances. Therefore, the snubber circuits can be configured to substantially reduce voltage overshoot and thus facilitate high speed switching of the switches of the switching circuit.

In addition, the half-bridge switching circuit system can be arranged to dissipate heat in an efficient manner. As an example, the half-bridge switching circuit can be arranged on a double-sided printed circuit board (PCB), such that the first set of switches can be coupled to a first surface of the double-sided PCB and the second set of switches can be coupled to a second surface of the double-sided PCB that is opposite the first surface. As a result, the half-bridge switching circuit can be arranged in a more compact arrangement of the PCB, and can dissipate heat in opposite directions with respect to the PCB. Additionally, the PCB can be arranged between two T-clad material arrangements that can be coupled to the PCB via one or more conductive material components on each surface of the PCB. Thus, the conductive material components can provide heat transfer from each surface of the PCB to the T-clad material arrangements, such that the T-clad material arrangements can radiate the heat from the PCB. Accordingly, the motor driver system can also provide sufficient heat dissipation of the associated circuitry.

Figure 1:
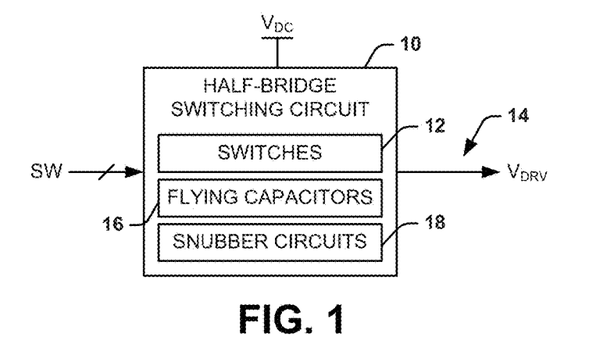
FIG. 1 illustrates an example of a half-bridge switching system.

FIG. 1 illustrates an example of a half-bridge switching system 10. The half-bridge switching system 10 can be implemented in any of a variety of switching applications, such as motor control applications to control the speed and direction of a motor. In the example of FIG. 1, the half-bridge switching system 10 includes is configured to generate an output voltage $V_{DRV}$ at an output 14 based on a DC rail voltage $V_{DC}$. As an example, the rail voltage $V_{DC}$ can split with a center tap, and can thus include a positive portion and a negative portion relative to the center tap. As an example, the output voltage $V_{DRV}$ can be provided to a motor to control the speed and/or torque of the motor.

In the example of FIG. 1, the half-bridge switching system 10 includes a set of switches 12 that are selectively activated via a set of switching signals SW to generate the output voltage $V_{DRV}$ based on the rail voltage $V_{DC}$. As an example, the switching signals SW can be generated via a programmable controller (e.g., a motor controller). For example, the switches 12 can be configured as gallium nitride (GaN) MOSFET switches that can be implemented for very high speed switching (e.g., greater than 50 kHz). Alternatively, the switches 12 can be configured as other types of switches, such as silicon (Si), silicon carbide, or other material-type switches. As an example, the switches 12 can include a first set of switches interconnecting a positive portion of the rail voltage $V_{DC}$ and the output 14 and a second set of switches interconnecting a negative portion of the rail voltage $V_{DC}$ and the output 14. In addition, the half-bridge switching system 10 includes a plurality of flying capacitors 16 that interconnect the sets of the switches 12 in a cascaded arrangement to provide the output voltage $V_{DRV}$ as having a variable amplitude based on the complementary activation of the sets of the switches 12.

In addition, in the example of FIG. 1, the half-bridge switching system 10 also includes snubber circuits 18. As an example, the snubber circuits 18 can each be configured as a series arrangement of a capacitor and a resistor, such that the snubber circuits 18 are arranged in parallel with the switches 12 and the flying capacitors 16. The snubber circuits 18 can thus be configured to substantially reduce the voltage overshoot across the switches 12 on the switching transitions. As a result, the snubber circuits 18 can be implemented to substantially mitigate damage to the switches 12 during operation of the half-bridge switching system 10. Additionally, by reducing the voltage overshoot across the switches 12, the snubber circuits 18 can also facilitate more rapid switching speeds of the switches 12, such as to implement the very high switching speeds of switches 12 that are configured as GaN MOSFET switches. Furthermore, the snubber circuits 18 in parallel with each of the flying capacitors 16 are likewise configured to mitigate an inductance associated with the flying capacitors 16 between the respective sets of the switches 12.

Figure 2:
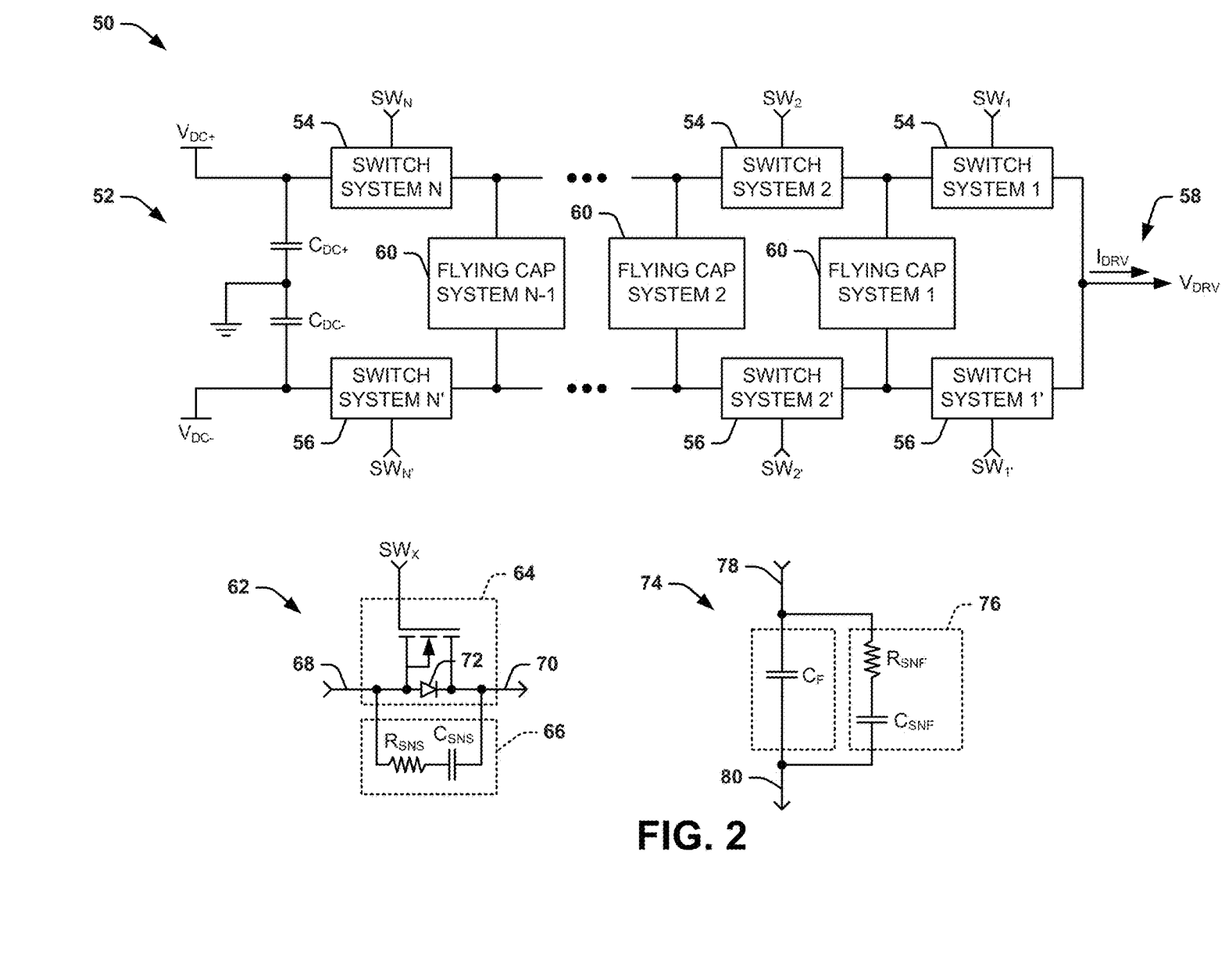
FIG. 2 illustrates an example diagram of a half-bridge switching circuit system.

FIG. 2 illustrates an example diagram 50 of a half-bridge switching system. The diagram 50 demonstrates a half-bridge switching circuit 52 that can correspond to the half-bridge switching system 10 in the example of FIG. 1. Therefore, reference is to be made to the example of FIG. 1 in the following description of the example of FIG. 2.

The half-bridge switching circuit 52 includes a cascaded arrangement of switch systems 54 and complementary switch systems 56. The switch systems 54 are arranged between a positive rail voltage $V_{DC+}$ (e.g., approximately 350 VDC) and an output 58 and the complementary switch systems 56 are arranged between a negative rail voltage $V_{DC-}$ (e.g., approximately −350 VDC) and the output 58. The switch systems 54 and the complementary switch systems 56 are thus arranged as complementary pairs having a quantity N stages, and are thus demonstrated as "SWITCH SYSTEM 1" through "SWITCH SYSTEM N" and "SWITCH SYSTEM 1'" through "SWITCH SYSTEM N'", respectively, where N is a positive integer. The $N^{th}$ stage of the switch systems 54 is coupled to the positive rail voltage $V_{DC+}$ and is separated from ground via a capacitor $C_{DC+}$, and the Nth stage of the complementary switch systems 56 is coupled to the negative rail voltage $V_{DC-}$ and is separated from ground via a capacitor $C_{DC-}$. The switch systems 54 are controlled via respective switching signals $SW_1$ through $SW_N$ (collectively "SW"), while the complementary switch systems 56 are controlled via respective switching signals $SW_{1'}$ through $SW_{N'}$ (collectively "SW'"), respectively.

The half-bridge switching circuit 52 also includes a plurality of flying capacitor systems 60 that interconnect the nodes between the switch systems 54 and the complementary switch systems 56. Thus, the flying capacitor systems 60 are likewise arranged in a cascaded sequence, and are thus demonstrated as "FLYING CAP SYSTEM 1" through "FLYING CAP SYSTEM N−1" in the example of FIG. 2. The flying capacitor systems 60 can include one or more capacitors (in parallel and/or series arrangements) that behave as a capacitor. The voltage across FLYING CAP SYSTEM M is nominally controlled to have a value of $M*(V_{DC+}-V_{DC-})/N$, where M corresponds to a given one of the N−1 flying capacitor systems 60. For an example of a 700 volt DC bus and N=11, the voltage across FLYING CAP SYSTEM 1 is 63.6 V, such that the voltage across FLYING CAP SYSTEM 2 is 127.2 V, etc. The nominal voltage across any of the switch systems 54 is the voltage across two neighboring FLYING CAP SYSTEMs, which is 63.6 V in the previous example. The number N of stages can thus correspond to a desired quantization of the output voltage $V_{DRV}$, with N+1 discrete voltage levels available, namely $V_{DC+}$, $V_{DC-}$, and N−1 evenly spaced voltage levels therebetween. For the example of a 700 volt DC bus and N=11, the 12 available hard-switched voltage levels are separated by approximately 63.6 volts. To which amplitude of the N+1 voltage levels the output voltage $V_{DRV}$ is provided is based on the selective complementary activation of the switch systems 54 and the complementary switch systems 56 via the switching signals SW and SW'.

In the example of FIG. 2, a given SWITCH SYSTEM M and a given SWITCH SYSTEM M' form a complementary pair controlled with mutually exclusive activation (e.g., with a controlled dead-time between deactivation of one and activation of the other). Accordingly, the current $I_{DRV}$ is provided at the output 58 to the motor (e.g., the motor 12), with the selective activation of the switch systems 54 and the complementary switch systems 56 defining an amplitude of the associated output voltage $V_{DRV}$. As an example, the selective complementary activation of the switch systems 54 and the complementary switch systems 56 can be such that a delay is provided between deactivation of one of the switch systems 54 and the complementary switch systems 56 and activation of the other of the switch systems 54 and the complementary switch systems 56 to substantially mitigate the occurrence of a shoot-through current.

In the example of FIG. 2, the diagram 50 demonstrates an example of a switch system 62 that can correspond to one of the switch systems 54 and/or complementary switch systems 56. As an example, all of the switch systems 54 and the complementary switch systems 56 can be arranged substantially identically, and can be configured substantially similar to the switch system 62. The switch system 62 includes a metal-oxide semiconductor field-effect transistor (MOSFET) switch 64 and a snubber circuit 66 that is arranged in parallel with the MOSFET switch 64 between a first terminal 68 and a second terminal 70 (e.g., first and second nodes, respectively). As an example, the MOSFET switch 64 can be configured as a GaN MOSFET. The MOSFET switch 64 is controlled by a switching signal $SW_X$ that can correspond to any of the switching signals $SW_1$ through $SW_N$ or any of the switching signals $SW_{1'}$ through $SW_{N'}$. The MOSFET switch 64 includes a body-diode 72 that may provide conduction of the current $I_{DRV}$ during deactivation of the complementary MOSFET, such as to provide a path for the current $I_{DRV}$ prior to the switch 64 being activated as a synchronous rectifier to reduce losses. The orientation of the MOSFET switch 64 when used as one of the switch systems 54 or 56 is such that when deactivated, the flying capacitor systems 60 cannot discharge. The snubber circuit 66 includes a series connection of a resistor $R_{SNS}$ and a capacitor $C_{SNS}$ between the first terminal 68 and the second terminal 70. Although the switch system 62 is shown with a single MOSFET and single series RC snubber, alternative arrangements with a plurality of MOSFETs in parallel and snubber circuits in parallel is understood to be within the scope of the systems described herein.

In addition, the diagram 50 demonstrates an example of a flying capacitor system 74 that can correspond to one of the flying capacitor systems 60. As an example, all of the flying capacitor systems 60 can be arranged substantially identically. The flying capacitor system 74 includes a flying capacitor $C_F$ and a snubber circuit 76 that is arranged in parallel with the flying capacitor $C_F$ between a first terminal 78 and a second terminal 80 (e.g., first and second nodes, respectively). Similar to as described previously regarding the snubber circuit 66, the snubber circuit 76 includes a series connection of a resistor $R_{SNF}$ and a capacitor $C_{SNF}$ between the first terminal 78 and the second terminal 80. Although the snubber circuit 76 is shown as a single series RC, alternative arrangements with many RC circuits in parallel is understood to be within the scope of the systems described herein.

The snubber circuits 66 and 76 can thus be configured to substantially mitigate the overvoltage across terminals 68 and 70 of the MOSFET switch 64 in the switch system 62 during switching transitions. As a result, the respective snubber circuits 66 and 76 can be implemented to substantially mitigate damage to the MOSFET switch 64 associated with each of the switch systems 54 and complementary switch systems 56 during operation of the motor driver system 14. Additionally, the snubber circuits 66 and 76 can also facilitate more rapid switching speeds of the MOSFET switch 64 to implement very high switching of the switch systems 54 and the complementary switch systems 56. Accordingly, the snubber circuits 66 and 76 can provide circuit protection and facilitate faster operation of the motor driver system 14.

Figure 3:
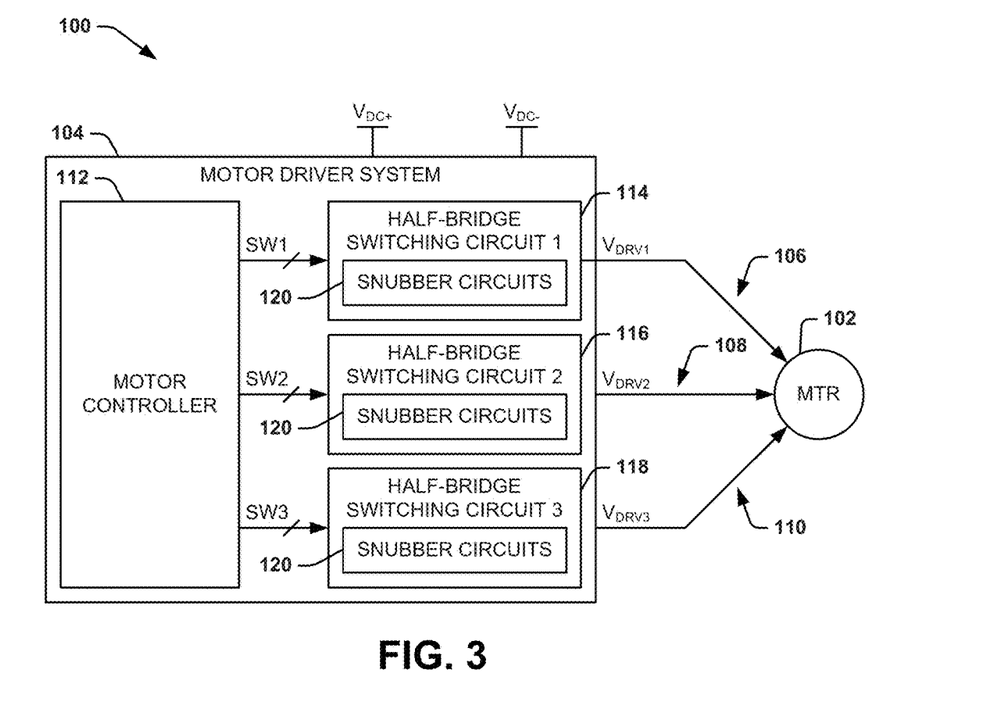
FIG. 3 illustrates another example of a motor system.

FIG. 3 illustrates another example of a motor system 100. The motor system 100 can be implemented in any of a variety of motor control applications to control the speed and/or torque of a motor 102. In the example of FIG. 3, the motor 102 can be configured as a three-phase motor. The motor system 100 includes a motor driver system 104 that is configured to generate a first output voltage $V_{DRV1}$ at a first output 106, a second output voltage $V_{DRV2}$ at a second output 108, and a third output voltage $V_{DRV3}$ at a third output 110. Each of the outputs 106, 108, and 110 are coupled to the motor 102, and thus the output voltages $V_{DRV1}$, $V_{DRV2}$, and $V_{DRV3}$ each correspond to separate respective phases of the three-phase motor 102. Accordingly, the output voltages $V_{DRV1}$, $V_{DRV2}$, and $V_{DRV3}$ are provided to the motor 102 to control the speed and/or torque of the motor 102. In the example of FIG. 3, the motor driver system 104 can be configured to generate each of the output voltages $V_{DRV1}$, $V_{DRV2}$, and $V_{DRV3}$ based on a differential voltage $V_{DC}$, demonstrated as a positive rail voltage $V_{DC+}$ and a negative rail voltage $V_{DC-}$, similar to as demonstrated previously in the example of FIG. 2.

In the example of FIG. 3, the motor driver system 104 includes a motor controller 112 that is configured to generate a first set of switching signals SW1, a second set of switching signals SW2, and a third set of switching signals SW3. Additionally, the motor driver system 104 includes a first half-bridge switching circuit 114, a second half-bridge switching circuit 116, and a third half-bridge switching circuit 118. The first half-bridge switching circuit 114 is configured to generate the first output voltage $V_{DRV1}$ based on the first set of switching signals SW1, the second half-bridge switching circuit 116 is configured to generate the second output voltage $V_{DRV2}$ based on the second set of switching signals SW2, and the third half-bridge switching circuit 118 is configured to generate the third output voltage $V_{DRV3}$ based on the third set of switching signals SW3. Therefore, the motor controller 112 can control the output voltages $V_{DRV1}$, $V_{DRV2}$, and $V_{DRV3}$ via the respective switching signals SW1, SW2, and SW3 and the respective half-bridge switching circuits 114, 116, and 118 to control the motor 102 (e.g., based on amplitude variations of the output voltages $V_{DRV1}$, $V_{DRV2}$, and $V_{DRV3}$ at 120° respective phase-delays).

Each of the half-bridge switching circuits 114, 116, and 118 can be configured substantially similar to the half-bridge switching circuit 52 in the example of FIG. 2, and can thus include a set of switches and a complementary set of switches, as well as an associated set of flying capacitors. Thus, the set of switches and a complementary set of switches can be selectively activated in a complementary manner via the respective set of the switching signals SW1, SW2, and SW3 to generate the respective output voltages $V_{DRV1}$, $V_{DRV2}$, and $V_{DRV3}$ based on the rail voltages $V_{DC+}$ and $V_{DC-}$. For example, the sets of switches and complementary switches can be configured as GaN MOSFETs.

In addition, in the example of FIG. 3, each of the switching circuits 114, 116, and 118 also includes snubber circuits 120. As an example, the snubber circuits 120 can each be configured substantially similar to the snubber circuits 66 and 74 in the example of FIG. 2, and can thus be configured as a series arrangement of a capacitor and a resistor that is arranged in parallel with the switches, the complementary switches, and the flying capacitors. The snubber circuits 120 can thus be configured to substantially reduce the voltage overshoot at the terminals of the switches and the complementary switches during switching transitions. As a result, the snubber circuits 120 can be implemented to substantially mitigate damage to the switches and the complementary switches during operation of the motor driver system 104. Additionally, by reducing the overvoltage at the terminals of the switches and the complementary switches the snubber circuits 120 can also facilitate more rapid switching speeds of the switches and the complementary switches.

While the example of FIG. 3 is described with respect to a three-phase motor control system, it is to be understood that the motor system 100 can be implemented in other motor control systems, and thus may implement any number of half-bridge switching systems. Additionally, while the description herein of the motor system 100 describes the manner of generating the output voltages $V_{DRV}$ to drive a motor, the principles and concepts described herein can apply equally when power is flowing in reverse, e.g., when the motor shaft is driven by another energy source, such as wind, water, or another energy source, as a generator, and the voltages $V_{DRV}$ is used to control the amount of power taken from the generator. Therefore, as described herein, the term "motor" is used to describe a motor that turns in response to the output voltage $V_{DRV}$, but can also be used to describe a generator that is configured to generate electricity.

Figure 4:
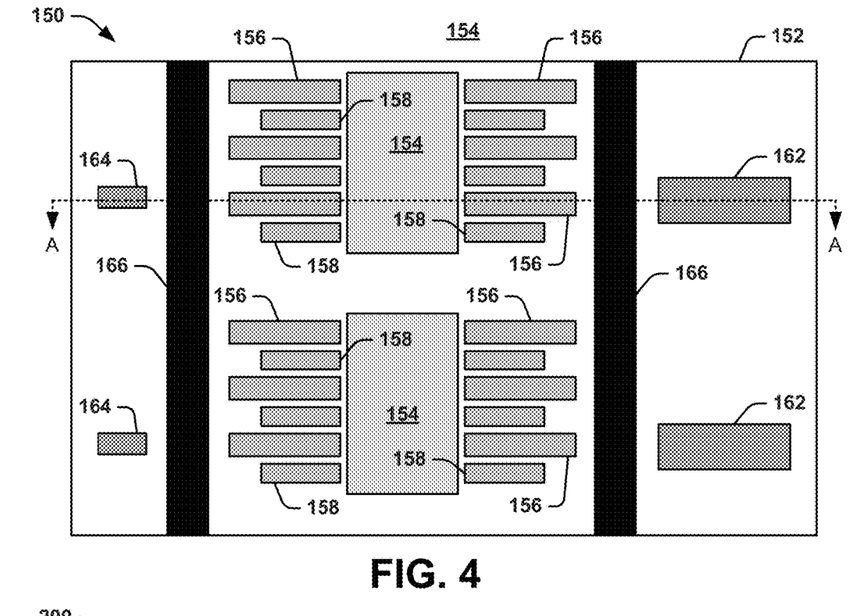
FIG. 4 illustrates an example diagram of a circuit layout.
Figure 5:
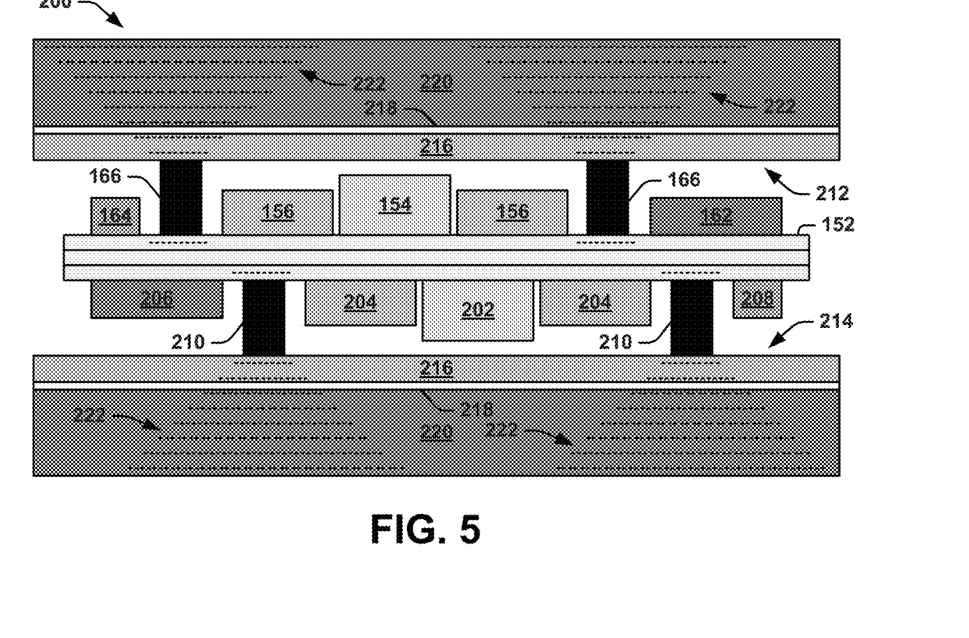
FIG. 5 illustrates another example diagram of a circuit layout.

FIG. 4 and FIG. 5 illustrate example diagrams 150 and 200 of a portion of a circuit layout. The circuit layout of FIG. 4 can correspond to a top-view of a printed circuit board (PCB) 152 on which a half-bridge switching circuit is fabricated. FIG. 5 shows a cross-sectional view of a portion of the circuit in the example of FIG. 4 taken along the dashed line "A". As an example, the PCB 152 can be a four-layer, double-sided PCB on which the components of the half-bridge switching circuit are mounted and wired. As an example, the half-bridge switching circuit can correspond to the half-bridge switching circuit 52 in the example of FIG. 2 and/or one of the half-bridge switching circuits 114, 116, and 118 in the example of FIG. 3.

The diagram 150 can correspond to a portion of the half-bridge switching circuit, such that additional parts of the half-bridge switching circuit can extend in any direction beyond the demonstrated boundaries of the PCB 152. The diagram 150 demonstrates a plurality of MOSFET switches 154 and a plurality of capacitors 156 and a plurality of resistors 158 that correspond to respective snubber circuits across the MOSFET switches 154. In the example of FIG. 4, the capacitors 156 and the resistors 158 are interleaved with respect to each other (not all have reference numbers for clarity of illustration). As an example, each of the MOSFET switches 154 can include multiple interleaved drain and source terminals, such that an associated snubber circuit (e.g., the snubber circuit 66 in the example of FIG. 2) can include a plurality of series connections of the capacitors 156 and the resistors 158 that are all arranged in parallel with a respective one of the MOSFET switches 154.

The cross-sectional view in the diagram 200 in the example of FIG. 5 demonstrates that the other side of the double-sided PCB 152 can be arranged similar, with similar components, including complementary MOSFET switches 202. The diagrams 150 and 200 also demonstrate a plurality of capacitors 162 (206) and a plurality of resistors 208 (164) that correspond to respective snubber circuits across the terminals of the flying capacitors. The flying capacitors are not shown in the example of FIGS. 4 and 5, but the terminals of each of the flying capacitors are routed on adjacent conductive layers of the double-sided PCB 152. One example of a four-layer arrangement of the double-sided PCB 152 can be such that the terminals of each of the flying capacitor systems are routed on the inner two layers of the double-sided PCB 152. For example, a given one of the flying capacitors can be conductively coupled to one of the MOSFET switches 154 and a respective one of the MOSFET switches 202 via a first conductive layer and a second conductive layer that is adjacent to the first conductive layer, respectively, of the double-sided PCB 152. In addition, the capacitance of each of the flying capacitor systems may be divided such that one half of the capacitance can be connected to one edge of the double-sided PCB 152 and the other half of the capacitance can be connected to the other edge of the double-sided PCB 152. The capacitor current is then split, with one half of the capacitor current being provided to one edge of the double-sided PCB 152 and the other half of the capacitor current being provided to the other edge of the double-sided PCB 152. Such an arrangement reduces the total stray inductance in series with each of the flying capacitor systems. In the example of FIG. 4, while the snubber circuit associated with each of the flying capacitors includes a single capacitor 162 and a single resistor 208, it is to be understood that the corresponding snubber circuit (e.g., the snubber circuit 74 in the example of FIG. 2) can include multiple series connections of the capacitors 162 and the resistors 208 that are all arranged in parallel with a respective one of the flying capacitors.

The diagrams 150 and 200 also demonstrate a set of thermally-conductive components 166 that extend along the surface of the PCB 152. As an example, the thermally-conductive components 166 can be formed from copper, aluminum, or a variety of other materials that are highly conductive of heat. The thermally-conductive components 166 may also take on shapes other than the straight bars shown in diagrams 150 and 200. As described in greater detail herein, the associated half-bridge switching system can be formed such that a T-clad material can be coupled to the thermally-conductive components 166 to provide efficient heat dissipation of the half-bridge switching circuit that is mounted to the PCB 152.

As described previously, the PCB 152 can be formed as a four-layer double-sided PCB, and can thus include circuit components coupled to an underside of the double-sided PCB 152 relative to the top-view of the double-sided PCB 152 in the example of FIG. 4. As an example, the MOSFET switches 154 can correspond to the switch systems 54 in the half-bridge switching circuit 52 while the MOSFET switches 202 can correspond to the complementary switch systems 56 of the half-bridge switching circuit 52 which can be mounted to an opposite surface of the double-sided PCB 152 in a manner similar to the MOSFET switches 154. Snubber circuits can be placed adjacent to MOSFET switches 202 in a manner similar to how snubber circuits formed by the capacitors 156 and the resistors 158 are placed adjacent to MOSFET switches 154. As another example, the double-sided PCB 152 can also include snubber circuits formed by the capacitors 162 and the resistors 208 for one flying capacitor and by capacitors 206 and resistors 164 for another flying capacitor. Furthermore, the double-sided PCB 152 can also include one or more thermally-conductive components 210 mounted on the opposite surface. Therefore, the double-sided PCB 152 can be arranged substantially similar to the arrangement demonstrated in the diagrams 150 and 200.

Similar to the diagram 150, the diagram 200 demonstrates the PCB 152 as a four-layer, double-sided PCB on which the components of the half-bridge switching circuit are mounted and wired. The diagram 200 demonstrates a MOSFET switch 154 and a plurality of capacitors 156 that correspond to a portion of the respective snubber circuit across the MOSFET switch 154 (e.g., along with the resistors 158 in the diagram 150 of the example of FIG. 4). The diagram 200 also demonstrates a MOSFET switch 202 and a plurality of capacitors 204 that correspond to a portion of the respective snubber circuit across the MOSFET switch 202 on an opposite surface of the double-sided PCB 152 relative to the MOSFET switch 154 and the capacitors 156. The MOSFET switch 202 and the capacitors 204 can correspond to one of the complementary switch systems of the associated half-bridge switching circuit (e.g., a complementary switch system 56 of the half-bridge switching circuit 52).

The diagram 200 also demonstrates the set of thermally-conductive components 166 on the first surface of the double-sided PCB 152 and a set of thermally-conductive components 210 on the opposite surface of the double-sided PCB 152. Each of the thermally-conductive bars 166 and 210 extend along the surface of the PCB 152. In the example of FIG. 5, a first T-clad material arrangement 212 is coupled to the thermally-conductive components 166 and a second T-clad material arrangement 214 is coupled to the thermally-conductive components 210. Each of the T-clad material arrangements 212 and 214 can include a first conductive layer 216 (e.g., copper) that is coupled (e.g., soldered) to the respective thermally-conductive components 166 and 210 (e.g., along an entirety of the length of the respective thermally-conductive components 166 and 210). Each of the T-clad material arrangements 212 and 214 also includes a thin electrically-insulating thermally-conductive layer 218 (e.g., ceramic) and a relatively thicker second conductive layer 220 (e.g., aluminum) that is coupled to the thin electrically-insulating thermally-conductive layer 218.

Based on the arrangement of the T-clad material arrangements 212 and 214, heat generated by the associated half-bridge switching circuit can be efficiently dissipated. Heat that is generated via the circuit components on the double-sided PCB 152 (e.g., the MOSFET switches 154 and 202, the capacitors 156, 162, and 204, the resistors 158 and 164, etc.) can be conducted through metallic layers of PCB 152 and into the thermally-conductive components 166 and 210. The heat can then be spread into the T-clad layer 216, across the insulating layer 218 and into the thick heat-spreading layers 220, as demonstrated diagrammatically in the example of FIG. 5 by the dashed lines 222. In addition, as an example, the thick heat-spreading layers 220 can be held at a lower temperature by external means (e.g. air or liquid convection). Therefore, based on the mounting of the electronic components of the half-bridge switching circuit to both surfaces of the double-sided PCB 152, and based on the coupling of the T-clad material arrangements 212 and 214 to the double-sided PCB 152 via the respective thermally-conductive components 166 and 210, the heat that is generated by the electronic components of the half-bridge switching circuit can be efficiently dissipated.

It is to be understood that the arrangement of the circuit components with respect to the double-sided PCB 152 in the examples of FIGS. 4 and 5 is provided by example only. It is to be understood that the components demonstrated in the diagrams 150 and 200 are not necessarily illustrated to scale, and are demonstrated merely to provide an exemplary relative layout of the associated components. Additionally, the layout of the circuit components in the diagrams 150 and 200 are provided as but one example. Furthermore, the use of a T-clad material arrangement to provide cooling for a circuit system is not limited to being implemented in half-bridge switching circuit depicted in the diagrams 150 and 200, but can be implemented in combination with thermally-conductive components in any of a variety of surface-mount technology (SMT) circuit systems in which efficient cooling is desired, either on one or both sides of a PCB. Thus, it is to be understood that the arrangement of the circuit components in the diagrams 150 and 200 can be provided in any of a variety of ways on the double-sided PCB 152 (or a single-sided PCB) to provide substantially optimal space-savings and heat-dissipation, as described herein.

Figure 6:
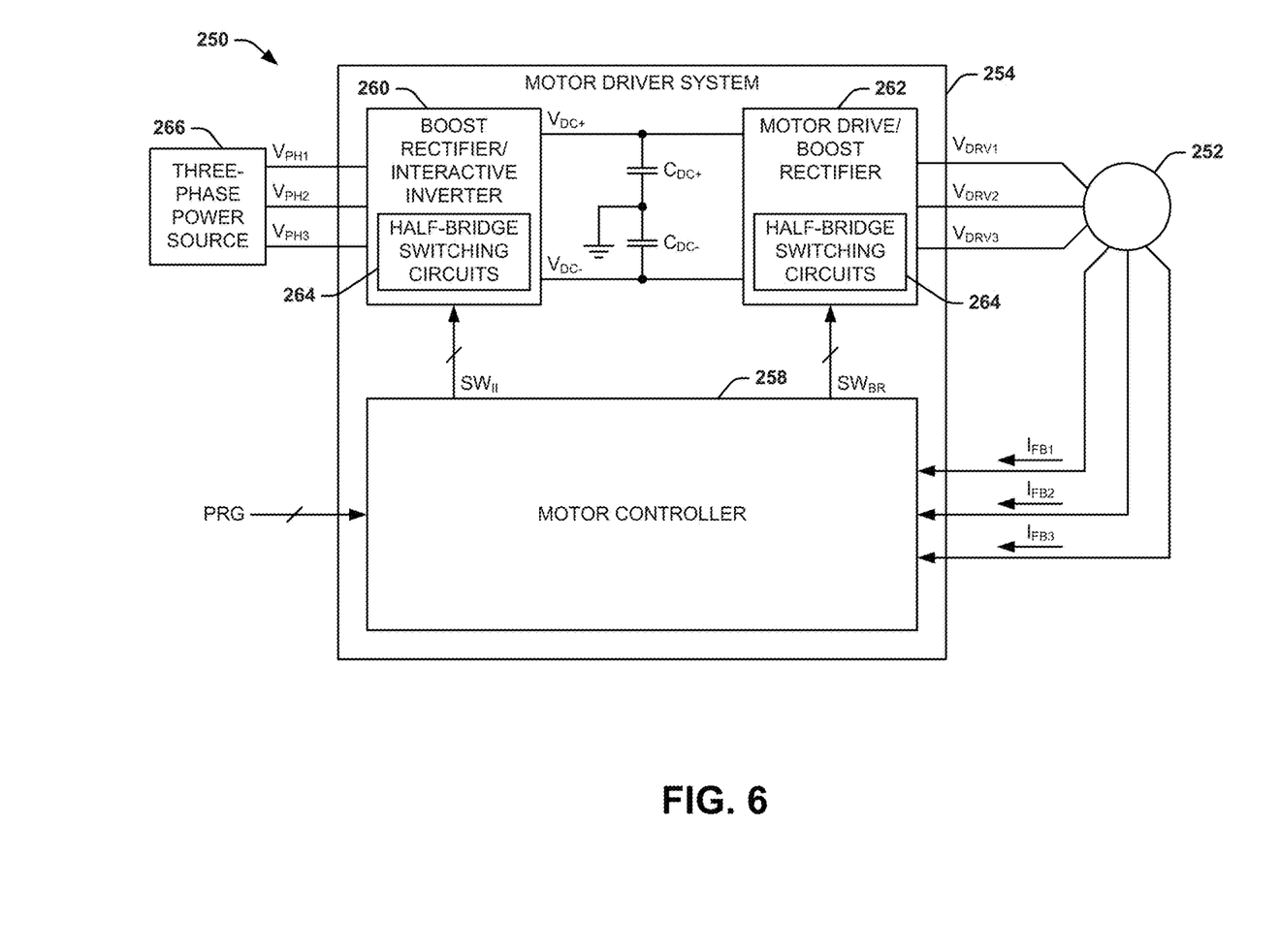
FIG. 6 illustrates yet another example of a motor system.

FIG. 6 illustrates yet another example of a motor system 250. The motor system 250 can be implemented in any of a variety of motor control applications to control the speed and/or torque of a motor 252. In the example of FIG. 6, the motor 252 can be configured as a three-phase motor. The motor system 250 includes a motor driver system 254 that is configured to generate a first output voltage $V_{DRV1}$, a second output voltage $V_{DRV2}$, and a third output voltage $V_{DRV3}$. Each of the output voltages $V_{DRV1}$, $V_{DRV2}$, and $V_{DRV3}$ correspond to separate respective phases provided to control the three-phase motor 252. Accordingly, the output voltages $V_{DRV1}$, $V_{DRV2}$, and $V_{DRV3}$ are provided to the motor 252 to control the speed and/or torque of the motor 252.

In the example of FIG. 6, the motor driver system 254 includes a motor controller 258, a boost rectifier/interactive inverter 260, and a motor drive/boost rectifier 262. Each of the boost rectifier/interactive inverter 260 and the motor drive/boost rectifier 262 includes three half-bridge switching circuits 264, with each of the half-bridge switching circuits 264 corresponding to a separate phase of the three-phase power of the motor system 250. When power is flowing from the three-phase power source 266 to the motor 252, power stage 260 is controlled as a boost rectifier and power stage 262 is controlled as a variable-speed motor drive. When power is flowing from a generator 252 back to the three-phase power source 266, power stage 262 is controlled as a boost rectifier and power stage 260 is controlled as a utility-interactive inverter. As an example, each of the half-bridge switching circuits 264 in power stages 260 and 262 can be arranged substantially similar to the half-bridge switching circuit 52 in the example of FIG. 2, and can thus include snubber circuits in parallel with each MOSFET switch, each complementary MOSFET switch, and each flying capacitor. In the example of FIG. 6, the boost rectifier/interactive inverter 260 receives a three-phase voltage, demonstrated as $V_{PH1}$, $V_{PH2}$, and $V_{PH3}$, from a three-phase power source 266, and is configured to generate a positive rail voltage $V_{DC+}$ and a negative rail voltage $V_{DC-}$ from the three-phase voltage $V_{PH1}$, $V_{PH2}$, and $V_{PH3}$ based on a set of switching signals $SW_{II}$. Similar to as described previously in the example of FIG. 2, the positive rail voltage $V_{DC+}$ is separated from ground via a capacitor $C_{DC+}$ and the negative rail voltage $V_{DC-}$ is separated from ground via a capacitor $C_{DC-}$. As an example, the ground reference shown is an arbitrary choice that minimizes the voltage relative to ground for any phase of the motor or three-phase power source, but other ground references may be chosen. The motor drive/boost rectifier 262 is configured to generate each of the output voltages $V_{DRV1}$, $V_{DRV2}$, and $V_{DRV3}$ based on the positive rail voltage $V_{DC+}$ and the negative rail voltage $V_{DC-}$, similar to as described previously in the example of FIG. 2, in response to switching signals $SW_{BR}$.

The motor controller 258 is configured to generate the switching signals $SW_{II}$ and $SW_{BR}$ that are provided to the boost rectifier/interactive inverter 260 and the motor drive/boost rectifier 262, respectively. In addition, the motor controller 258 is demonstrated as receiving a plurality of feedback currents $I_{FB1}$, $I_{FB2}$, and $I_{FB3}$ that can correspond, respectively, to the three-phases of the motor 252. As an example, the feedback currents $I_{FB1}$, $I_{FB2}$, and $I_{FB3}$ can be indicative of angle of rotation of the motor 252 (e.g., such as in encoder implementations or other applications that may require angular feedback of rotation of the motor 252). The feedback currents $I_{FB1}$, $I_{FB2}$, and $I_{FB3}$ can also correspond to the switching control scheme defined by the switching signals $SW_{II}$ and/or $SW_{BR}$, such that the output voltages $V_{DRV1}$, $V_{DRV2}$, and $V_{DRV3}$ can be generated based on information associated with the feedback currents $I_{FB1}$, $I_{FB2}$, and $I_{FB3}$.

Furthermore, as another example, the motor controller 258 can be at least partially based on a single programmable device (e.g., a SoC FPGA) which contains at least one processor core surrounded by a large amount of programmable logic, that can be programmed with respect to the control scheme of the generation of the switching signals $SW_{II}$ and $SW_{BR}$. In the example of FIG. 6, the motor controller 258 receives a set of programming signals PRG that can be provided from a computer system, such as via a peripheral connection. For example, the programming signals PRG can be provided via a universal serial bus (USB), a serial port, or other external connection means. The program may be updated in the field based on the programming signals PRG. Therefore, the motor controller 258 can be programmable to provide the switching signals $SW_{11}$ and/or the switching signals $SW_{BR}$ in a predetermined control scheme for generating the rail voltages $V_{DC+}$ and $V_{DC-}$ and/or the output voltages $V_{DRV1}$, $V_{DRV2}$, and $V_{DRV3}$, such as based on the feedback currents $I_{FB1}$, $I_{FB2}$, and $I_{FB3}$.

Accordingly, the motor driver system 254 can be implemented to include snubber circuits to substantially mitigate damage to the switches in the half-bridge switching circuits 264 during operation of the motor driver system 254. Additionally, by reducing the voltage across the terminals of the switches in the half-bridge switching circuits 264, the snubber circuits can also facilitate more rapid switching speeds of the switches, such as to implement the very high switching speeds, similar to as described previously. Furthermore, the half-bridge switching circuits 264 can each be mounted to a double-sided PCB, such as demonstrated in the diagrams 150 and 200 in the examples of FIGS. 4 and 5. The half-bridge switching circuits 264 can thus be arranged between T-clad material arrangements coupled to thermally-conductive bars on the double-side PCB, such as demonstrated in the diagrams 150 and 200 in the examples of FIGS. 4 and 5, to provide more efficient heat dissipation of the half-bridge switching circuits 264.

What have been described above are example embodiments. It is, of course, not possible to describe every conceivable combination of components or methodologies for purposes of describing the embodiments, but one of ordinary skill in the art will recognize that many further combinations and permutations of the embodiments are possible. Accordingly, the embodiments are intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A half-bridge switching circuit system comprising:
   a first plurality of switches arranged between a first rail voltage and an output on which an output voltage is provided;
   a second plurality of switches arranged between a second rail voltage and the output, the first and second pluralities of switches being controlled via a plurality of switching signals;
   a plurality of flying capacitors arranged to interconnect the first and second pluralities of switches; and
   a plurality of snubber circuits that are each arranged in parallel with a respective one of the plurality of flying capacitors, the first plurality of switches, and the second plurality of switches.

2. The system of claim 1, wherein each of the plurality of snubber circuits comprises at least one arrangement of a capacitor and a resistor arranged in series with respect to each other and in parallel with terminals associated with the at least one of each of the respective plurality of flying capacitors and each of the first and second respective pluralities of switches.

3. The system of claim 1, wherein the first plurality of switches and the second plurality of switches are selectively switched in a complementary manner in response to the plurality of switching signals to provide the output voltage at the output.

4. The system of claim 1, wherein each of the first plurality of switches and the second plurality of switches are fabricated as gallium nitride (GaN) MOSFET switches.

5. The system of claim 1, wherein the half-bridge switching circuit is disposed on a double-sided printed-circuit board (PCB), such that the first plurality of switches are arranged on a first surface of the double-sided PCB and the second plurality of switches are arranged on a second surface of the double-sided PCB that is opposite the first surface.

6. The system of claim 5, wherein at least a portion of the plurality of snubber circuits comprises a capacitor and a resistor arranged in series, wherein one of the capacitor and the resistor associated with each of the plurality of snubber circuits is arranged on the first surface of the double-sided PCB and the other one of the capacitor and the resistor associated with each respective one of the plurality of snubber circuits is arranged on the second surface of the double-sided PCB.

7. The system of claim 5, wherein the double-sided PCB is mounted between a first T-clad material arrangement that is coupled to the first surface of the double-sided PCB and a second T-clad material arrangement that is coupled to the second surface of the double-sided PCB.

8. The system of claim 7, wherein the first T-clad material arrangement is coupled to the first surface of the double-sided PCB via at least one first thermally-conductive component and the second T-clad material arrangement is coupled to the second surface of the double-sided PCB via at least one second thermally-conductive component, such that each of first T-clad material arrangement and the second T-clad material arrangement and each of the first surface and second surface of the double-sided PCB are in contact with the respective at least one first and second thermally-conductive components.

9. The system of claim 5, wherein the double-sided PCB is arranged as a multi-layer double-sided PCB, wherein each of the plurality of flying capacitors are conductively coupled to a respective sequential pair of the first plurality of switches and a respective sequential pair of the second plurality of switches via a first conductive layer and a second conductive layer adjacent to the first conductive layer, respectively, of the multi-layer double-sided PCB.

10. A motor driver system comprising the half-bridge switching circuit system of claim 1, the motor driver system further comprising a motor controller configured to generate the plurality of switching signals, such that the half-bridge switching circuit system is configured to generate the output voltage that is provided to a motor.

11. The system of claim 10, wherein the motor controller is configured as a system-on-chip field-programmable gate array (SoC FPGA) that is programmable to provide a control algorithm with respect to the generation of the plurality of switching signals.

12. The system of claim 10, wherein the half-bridge switching circuit is a first half-bridge switching circuit, the system further comprising a second half-bridge switching circuit and a third half-bridge switching circuit, wherein the first, second, and third half-bridge switching circuits are configured to provide a respective first, second, and third output voltage via respective outputs to respective first, second, and third phases of a three-phase motor based on the first rail voltage and the second rail voltage.

13. The system of claim 12, further comprising a fourth half-bridge switching circuit, a fifth half-bridge switching circuit, and a sixth half-bridge switching circuit that are collectively configured to convert a three-phase line voltage into the first rail voltage and the second rail voltage.

14. The system of claim 10, wherein the motor controller is configured to generate the plurality of switching signals based at least in part on at least one angular feedback signal provided from the motor.

15. A circuit system comprising:
a printed-circuit board (PCB) comprising a surface on which a plurality of circuit components are arranged;
at least one thermally-conductive component that is coupled to the PCB, the at least one thermally-conductive component being configured to conduct heat that is generated on the PCB via the plurality of circuit components; and
a T-clad material arrangement that is coupled to the at least one thermally-conductive component via a first material layer of the T-clad material arrangement and is spaced apart from the PCB via the at least one thermally-conductive component, the T-clad material arrangement being configured to conduct the heat from the at least one thermally-conductive component to the first material layer of the T-clad material arrangement to radiate the heat from a second material layer of the T-clad material arrangement that is on an opposite surface of the T-clad material layer.

16. The system of claim 15, wherein the PCB is configured as a double-sided PCB comprising a first surface on which a first plurality of circuit components are arranged and a second surface on which a second plurality of circuit components are arranged, the second surface being opposite the first surface on the double-sided PCB, wherein the at least one thermally-conductive component that is coupled to the first surface of the double-sided PCB, wherein the T-clad material arrangement is configured as a first T-clad material arrangement that is coupled to the at least one first thermally-conductive component, the circuit system further comprising:
at least one second thermally-conductive component that is coupled to the second surface of the double-sided PCB, the at least one second thermally-conductive component being configured to conduct heat that is generated on the double-sided PCB via the second plurality of circuit components; and
a second T-clad material arrangement that is coupled to the at least one second thermally-conductive component via a respective first material layer and is configured to conduct the heat from the at least one second thermally-conductive component to the respective first material layer.

17. The system of claim 15, wherein the plurality of circuit components are arranged as a half-bridge switching circuit comprising:
a first plurality of switches arranged between a first rail voltage and an output on which an output voltage is provided;
a second plurality of switches arranged between a second rail voltage and the output, the first and second pluralities of switches being controlled via a plurality of switching signals;
a plurality of flying capacitors arranged to interconnect the first and second pluralities of switches; and
a plurality of snubber circuits that are each arranged in parallel with a respective one of the plurality of flying capacitors, the first plurality of switches, and the second plurality of switches.

18. A motor driver system comprising the half-bridge switching circuit system of claim 17, the motor driver system further comprising a motor controller configured to generate the plurality of switching signals, such that the half-bridge switching circuit system is configured to generate the output voltage that is provided to a motor.

19. A motor driver system comprising:
a motor controller configured to generate a plurality of switching signals;
a half-bridge switching circuit configured to provide an output voltage via an output, the half-bridge switching circuit comprising a first plurality of switches arranged between a first rail voltage and the output and a second plurality of switches arranged between a second rail voltage and the output, the first and second pluralities of switches being controlled via the plurality of switching signals, the half-bridge switching circuit further comprising a plurality of flying capacitors arranged to interconnect the first and second pluralities of switches, and further comprising a plurality of snubber circuits such that each of the plurality of flying capacitors, each of the first plurality of switches, and each of the second plurality of switches is arranged in parallel with a respective one of the plurality of snubber circuits; and
a double-sided printed-circuit board (PCB) comprising a first surface on which the first plurality of switches are arranged and a second surface on which the second plurality of switches are arranged, the second surface being opposite the first surface on the double-sided PCB.

20. The system of claim 19, further comprising:
a first T-clad material arrangement that is coupled to the first surface of the double-sided PCB;
a second T-clad material arrangement that is coupled to the second surface of the double-sided PCB;
at least one first thermally-conductive component that interconnects the first T-clad material arrangement and the first surface of the double-sided PCB; and
at least one second thermally-conductive bar that interconnects the second T-clad material arrangement and the second surface of the double-sided PCB.

21. The system of claim 19, wherein the motor controller is configured as a system-on-chip field-programmable gate array (SoC FPGA) that is programmable to provide a control algorithm with respect to the generation of the plurality of switching signals.

22. The system of claim 19, wherein the double-sided PCB is arranged as a multi-layer double-sided PCB, wherein each of the plurality of flying capacitors is conductively coupled to a respective sequential pair of the first plurality of switches and a respective sequential pair of the second plurality of switches via a first conductive layer and a second conductive layer adjacent to the first conductive layer, respectively, of the multi-layer double-sided PCB.

23. The system of claim 19, wherein each of the first plurality of switches and the second plurality of switches are fabricated as gallium nitride (GaN) MOSFET switches.

* * * * *